(12) United States Patent
Kamijima

(10) Patent No.: US 6,635,408 B2
(45) Date of Patent: Oct. 21, 2003

(54) RESIST PATTERN FORMING METHOD, FRAME PLATING METHOD AND MANUFACTURING METHOD OF THIN-FILM MAGNETIC HEAD

(75) Inventor: Akifumi Kamijima, Tokyo (JP)

(73) Assignee: TDK Corporation, Tokyo (JP)

( * ) Notice: Subject to any disclaimer, the term of this patent is extended or adjusted under 35 U.S.C. 154(b) by 172 days.

(21) Appl. No.: 09/790,682

(22) Filed: Feb. 23, 2001

(65) Prior Publication Data

US 2002/0037476 A1 Mar. 28, 2002

(30) Foreign Application Priority Data

Feb. 25, 2000 (JP) ......................................... 2000-049353

(51) Int. Cl.[7] .............................. G03F 7/40; G03C 5/56
(52) U.S. Cl. ....................... 430/313; 430/311; 430/317; 430/330; 430/270.1
(58) Field of Search ................................ 430/313, 311, 430/317, 330, 270.1

(56) References Cited

U.S. PATENT DOCUMENTS 5,721,078 A 2/1998 Kamijima ................. 430/11
5,725,997 A 3/1998 Kamijima ................. 430/325
5,747,198 A 5/1998 Kamijima ................. 430/11

FOREIGN PATENT DOCUMENTS

| JP | 10-73927 | | 3/1998 |
| JP | 11-7662 | * | 1/1999 |
| JP | 11-204399 | | 7/1999 |
| JP | 2000-112150 | * | 4/2000 |

* cited by examiner

Primary Examiner—Mark F. Huff
Assistant Examiner—Daborah Chacko-Davis
(74) Attorney, Agent, or Firm—Oblon, Spivak, McClelland, Maier & Neustadt, P.C.

(57) ABSTRACT

A method of forming a resist pattern includes a step of forming a resist pattern on a substrate or on a layer formed on a substrate using a resist material containing a material generating acid by exposure or heating, a step of coating only a water-soluble cross-linking agent on the resist pattern, the water-soluble cross-linking agent being cross-linked in the presence of acid, a step of coating a resin material containing at least a water-soluble resin on the water-soluble cross-linking agent, and a step of exposing or heating the resist pattern to generate acid from the resist pattern, a cross-linking reaction of the water-soluble cross-linking agent being occurred in the presence of the generated acid to form a covering layer over the resist pattern.

18 Claims, 3 Drawing Sheets

RESIST PATTERN FORMING METHOD, FRAME PLATING METHOD AND MANUFACTURING METHOD OF THIN-FILM MAGNETIC HEAD

FIELD OF THE INVENTION

The present invention relates to a method of forming a resist pattern of a thin-film device or a thick-film device, a frame plating method for a thin-film device or a thick-film device, and a method of manufacturing a thin-film magnetic head.

DESCRIPTION OF THE RELATED ART

Japanese patent publication Nos. 10073927A and 11204399A disclose a fine pattern forming method called as "RELACE" used in a fabrication of a semiconductor device.

This known method makes it possible to reduce the resist hole diameter and the separating width of a resist pattern by covering a resist pattern containing a material generating acid by exposure with a fine pattern-forming material containing a material cross-linked in the presence of acid, by mixing-baking or exposing them to generate acid in the resist pattern, and by forming a cross-linked layer generating on the interface as a covering layer of the resist pattern to thicken the resist pattern.

According to the known method, since the fine pattern-forming material is composed of a mixture of a water-soluble resin and a water-soluble cross-linking agent, it is very difficult to lower the mixing-baking temperature. Definitely, the mixing-baking temperature is lowered if concentrations of the water-soluble cross-linking agent is increased. However, if the concentrations of the water-soluble cross-linking agent is increased, cross-linking at room temperature between the water-soluble resin and the water-soluble cross-linking agent will progress causing the fine pattern-forming material preserved at roan temperature to become chemically unstable.

Particularly, in case that this known method is applied to a fabrication of a thin-film device or a thick-film device which use thick resist films, it is difficult to always form a highly precise resist pattern. This is because since heating is required twice for such the thick resist pattern at the high mixing-baking temperature of 105° C. or more, the resist pattern itself will deform due to the applied heat. This tendency of deformation is strong in a high-resolution resist material because it will have a lower heat resistance.

Japanese patent publication No. 10073927A discloses that the fine pattern-forming material may contain only a water-soluble cross-linking agent. However, since such cross-linking agent has a low molecular weight and thus a resist pattern made of the cross-linking agent only will become thin and will not so shrink, desired reduction of the resist hole diameter and the separating width of the resist pattern by the cross-linking will not be expected. Therefore, when performing the known method, it is necessary to use a mixture of a water-soluble resin and a water-soluble cross-linking agent as the fine pattern-forming material.

SUMMARY OF THE INVENTION

It is therefore an object of the present invention to provide a resist pattern forming method, a frame plating method using a resist pattern formed by the method, and a method of manufacturing a thin-film magnetic head, whereby a fine and high-resolution resist pattern can be stably formed.

According to the present invention, a method of forming a resist pattern includes a step of forming a resist pattern on a substrate or on a layer formed on a substrate using a resist material containing a material generating acid by exposure or heating, a step of coating only a water-soluble cross-linking agent on the resist pattern, the water-soluble cross-linking agent being cross-linked in the presence of acid, a step of coating a resin material containing at least a water-soluble resin on the water-soluble cross-lining agent, and a step of exposing or heating the resist pattern to generate acid from the resist pattern, a cross-linking reaction of the water-soluble cross-liking agent being occurred in the presence of the generated acid to form a covering layer over the resist pattern.

A frame plating method according to the present invention includes a step of plating a pattern using the resist pattern with the covering layer formed by the above-mentioned resist pattern forming method as a frame, and a step of removing the resist pattern with the covering layer. In a manufacturing method of a thin-film magnetic head according to the present invention, a magnetic pole is plated by the above-mentioned frame plating method.

The water-soluble cross-linking agent and the water-soluble resin are independently prepared and coated in isolation. Thus, the water-soluble cross-linking agent and the water-soluble resin can be kept in the stable state without inducing room-temperature cross-linking reaction until they are coated and thus partially mixed. Of course, sufficient polymerization can be expected. Therefore, even when a fine resist pattern of a thin-film device or a thick-film device, with a large thickness, is to be formed, a good cross-linking reaction can be generated even at a low mixing-baking temperature. Thus, a highly precise resist pattern without the distortion by heat can be stably obtained. In addition, a resist material providing a high resolution but having a low heat-resistance can be used. Consequently, a more fine and highly precise resist pattern can be stably obtained.

It is preferred that the resin material containing at least a water-soluble resin consists of only a water-soluble resin, or that the resin material containing at least a water-soluble resin consists of a water-soluble resin and a water-soluble cross-linking agent with a low concentration.

It is also preferred that the method further includes a step of partially removing the water-soluble cross-linking agent by centrifugal force after coating only the water-soluble cross-linking agent on the resist pattern.

It is preferred that the method further includes a step of entirely exposing a surface of the formed resist pattern before coating the water-soluble cross-linking agent on the resist pattern, and/or a step of performing a surface treatment of the formed resist pattern by using an acid liquid or an acid gas before coating the water-soluble cross-linking agent on the resist pattern.

Further objects and advantages of the present invention will be apparent from the following description of the preferred embodiments of the invention as illustrated in the accompanying drawings.

DESCRIPTION OF THE PREFERRED EMBODIMENTS

Figure 1A:
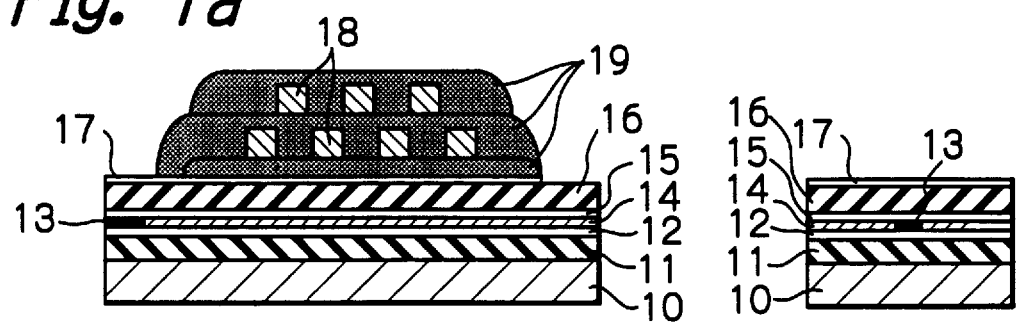
FIGS. 1a to 1d show sectional views in a plane passing through a track center of a thin-film magnetic head and sectional views seen from an air bearing surface (ABS), illustrating a manufacturing process of the magnetic head as a preferred embodiment according to the present invention.

FIGS. 1a to FIG. 1d illustrate a manufacturing process of a thin-film magnetic head as a preferred embodiment according to the present invention. Each figure shows a sectional view in a plane passing through a track center of the magnetic head and a sectional view seen from ABS.

The magnetic head in this embodiment is a composite thin-film magnetic head with integrally multi-layered inductive write head part and magnetoresistive effect (MR) read head part. In modification, the magnetic head may have only an inductive write head part.

First, an insulation layer 10 is formed on a substrate not shown made of a ceramic material such as AlTiC. This insulation layer 10 is made of $Al_2O_3$, $SiO_2$ or others, and is deposited preferably with a thickness of about 1,000–20,000 nm by sputtering or other methods.

Then, on the insulation layer 10, a lower shield layer 11 is formed, and on the lower shield layer 11, an insulation layer 12 for a shield gap layer is formed. The lower shield layer 11 is made of FeAlSi, NiFe, CoFe, CoFeNi, FeN, FeZrN, FeTaN, CoZrNb, CoZrTa or others, and is deposited preferably with a thickness of about 100–5000 nm by sputtering or plating or other methods. The shield gap insulation layer 12 is made of $Al_2O_3$, $SiO_2$ or others, and is deposited preferably with a thickness of about 10–200 nm by sputtering or other methods.

Then, a MR element 13 is formed on the insulation layer 12, and also lead conductors 14 for electrical connection across the MR element 13 are formed.

The MR element 13 can be formed by a single layered structure of magnetic material, but preferably it is formed by a multi-layered structure of alternatively stacked magnetic and non-magnetic materials. As for the magnetic material, NiFe, NiFeRh, FeMn, NiMn, Co, Fe, NiO, NiFeCr or others may be preferably used, and as for the non-magnetic material, Ta, Cu, Ag or others may be preferably used. As for the multi-layered structure, a stacked structure of three layers such as NiFeRh/Ta/NiFe, or a stacked structure of multi-layers such as NiFe/Cu/NiFe/FeM, NiFe/Cu/Co/FeMn, Cu/Co/Cu/NiFe, Fe/Cr, Co/Cu, Co/Ag or others, can be used. In a modification, a plurality of stacked units, each of which consists of the above-mentioned stacked structure, can be used as for the multi-layered structure.

In case of the multi-layered structure, a thickness of the magnetic material layer is preferably in a range of about 0.5–50 nm, more preferably in a range of about 1–25 nm, and a thickness of the non-magnetic material layer is preferably in a range of about 0.5–50 nm, more preferably in a range of about 1–25 nm. The number of the stacked units is to be repeatedly stacked is preferably in a range of 1–30, more preferably in a range of 1–20. The total thickness of the MR element 13 is preferably in a range of about 5–100 nm, more preferably in a range of about 10–60 nm.

Each layers of the MR element is deposited by sputtering, plating or other methods.

The lead conductors 14 are made of W, Cu, Au, Ag, Ta, Mo, CoPt or others, and is deposited preferably with a thickness of about 10–500 nm, more preferably with a thickness of about 50–300 nm, by sputtering, plating or other methods.

After this process, a shield gap insulation layer 15 is deposited on the MR element 13 and on the lead conductors 14. This insulation layer 15 is made of $Al_2O_3$, $SiO_2$ or others, and is deposited, by sputtering or other methods, preferably with a thickness of about 5–500 nm, more preferably with a thickness of about 10–200 nm.

Each layer of the MR reproducing head element is patterned by usual lift-off method using resist patterns, ion milling method or their combined method.

Then, a magnetic material is deposited to form a layer which serves as both of an upper shield layer of the MR element 13 and a lower magnetic pole 16 of the recording head element, and on the deposited layer, an insulation material is deposited to form a recording gap 17.

The layer for the lower magnetic pole 16 is made of soft magnetic material such as NiFe, CoFe, CoFeNi, FeN or others, and is deposited with a proper thickness of about 500–4,000 nm by plating method, sputtering method or other methods. The insulation layer for the recording gap 17 is made of $Al_2O_3$, $SiO_2$ or others, and is deposited with a thickness of about 10–500 nm.

Thereafter, on the recording gap 17, a coil 18 and an insulation layer 19 for embedding the coil 17 are formed. The coil 18 is made of a conducting material such as Cu, and formed with a thickness of about 2000–5000 nm by frame plating method or other methods. The insulation layer 19 is formed by hot cured photo-resist material with a thickness of about 3,000–20,000 nm.

The multi-layered structure of the thin-film magnetic head after the processes described above is shown in FIG. 1a. The coil 18 can be formed in a two layer configuration as shown in the figure, in a three or more layer configuration, or of course in a single layer configuration.

Figure 1B:
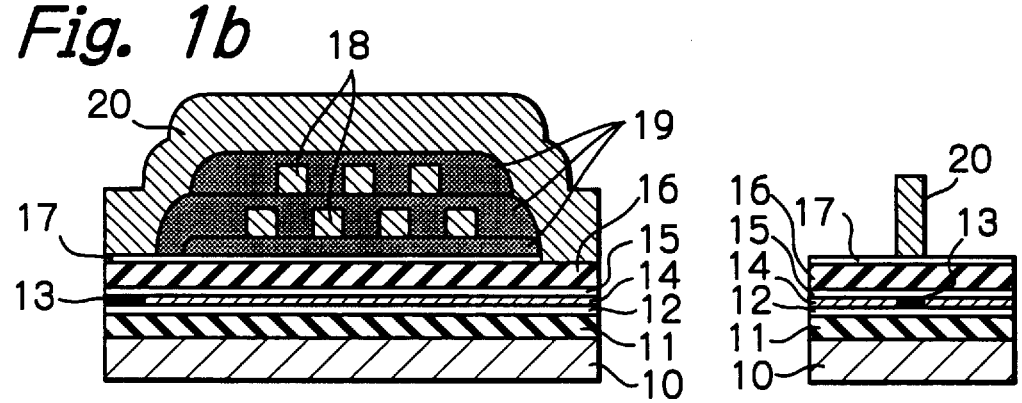

Then, as shown in FIG. 1b, an upper magnetic pole 20 which has a magnetic pole portion at ABS side and a backside magnetic yoke portion is formed on the insulation layer 19 by frame plating method. The upper magnetic pole 20 is made of a soft magnetic material such as NiFe, CoFe, CoFeNi, FeN or others, and is deposited preferably with a thickness of about 3,000–5,000 nm. At this process, the shape of the magnetic pole portion of the upper magnetic pole 20 seen from ABS side is structured as shown in FIG. 1b.

Hereinafter, a frame plating method used for formation of the upper magnetic pole 20 is described in detail.

FIGS. 2a to 2j illustrate a detail manufacturing process of forming such upper magnetic pole by the frame plating method in this embodiment.

Figure 2A:
FIGS. 2a to 2j show sectional view illustrating an upper pole forming process using a frame plating method according to the embodiment shown in FIG. 1.
Figure 2B:

On the recording gap 17 shown in FIG. 2a, a metallic under film 21 which is preferably made of the same material as that of a layer to be plated by the following frame plating, such as Cu, NiFe, Au or others, is deposited with a thickness of about 10–500 nm as shown in FIG. 2b.

Figure 2C:
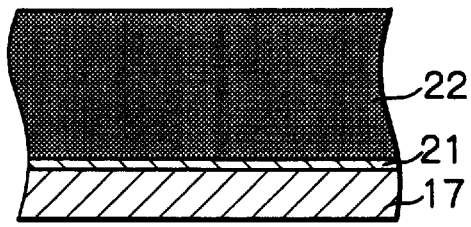
Figure 2D:
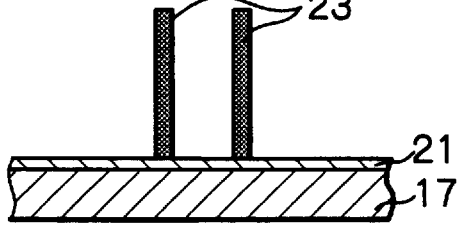
Figure 2E:
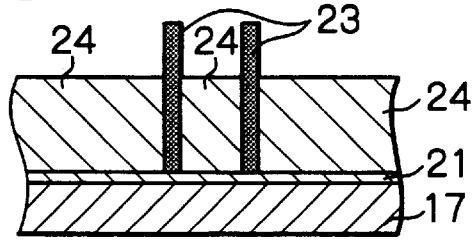
Figure 2F:
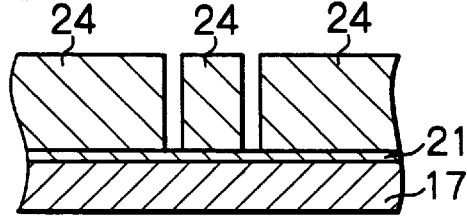

Then, a resist material 22 is coated as shown in FIG. 2c on the metallic under film 21 and a resist pattern with covering layer 23 is formed as shown in FIG. 2d. This forming process of the resist pattern with covering layer which is important feature of the present invention will be described in detail later. Then, as shown in FIG. 2e, a soft magnetic material such as NiFe, CoFe, CoFeNi, FeN or others is plated using thus the resist pattern with covering layer 23 as a frame to form a plated layer 24. After this process, as shown in FIG. 2f, the resist pattern 23 is removed by proper organic solvent solution.

Figure 2G:
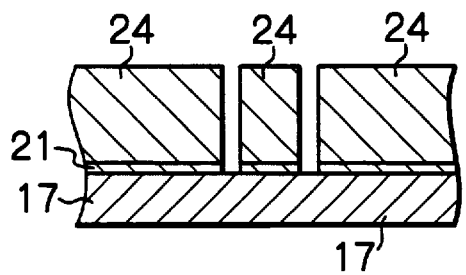

Thereafter, as shown in FIG. 2g, by using thus formed plated layer 24 as a mask, ion milling is implemented so that a resist-pattern removed area, uncovered by the mask, of the metallic under film 21 is removed.

Figure 2H:
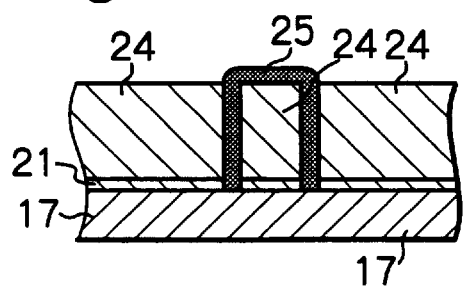
Figure 2I:
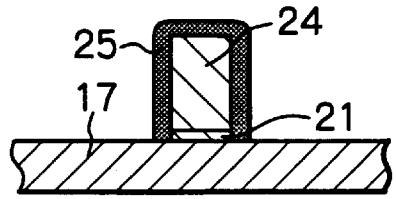
Figure 2J:
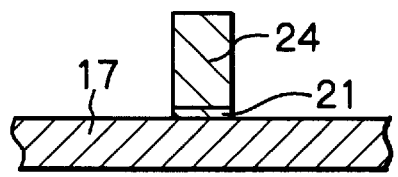

Then, as shown in FIG. 2h, the upper part and circumference of a portion which should leave of the plated layer 24 are covered by a resist layer 25. Next, unnecessary parts of the plated layer 24 and the metallic under film 21 are removed by wet etching, and then the resist layer 25 is removed by using an organic solvent to form the upper magnetic pole 20 shown in FIG. 2j.

Figure 1C:
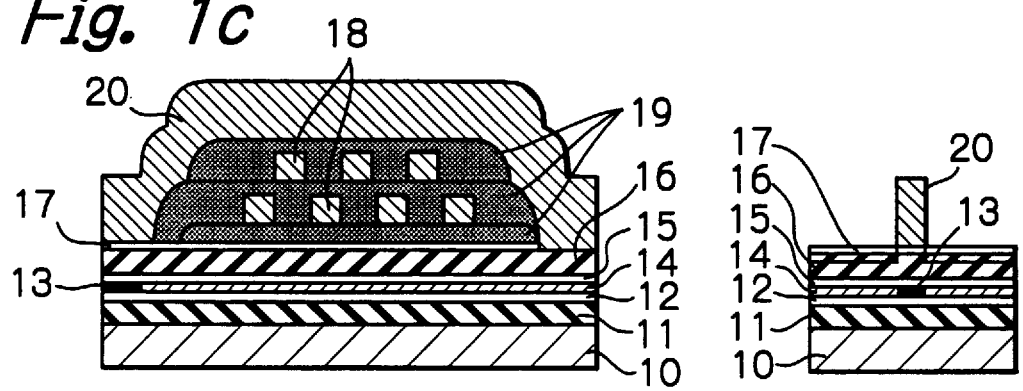

Thereafter, as shown in FIG. 1c, by using thus formed upper magnetic pole 20 as a mask, dry etching such as ion milling, RIE (Reactive Ion Etching) or others is implemented so that an area, uncovered by the mask, of the insulation layer for the recording gap 17 are removed and over milling or etching is done into the uncovered area of the magnetic layer for the lower magnetic pole 16.

Figure 1D:
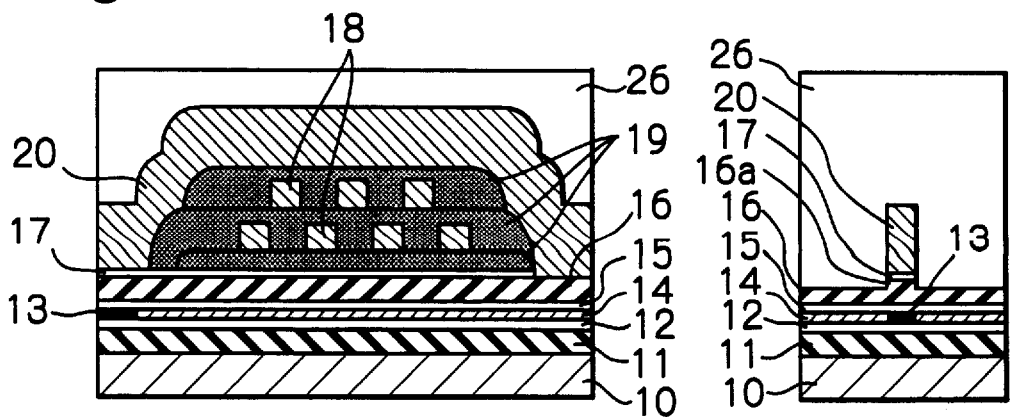

By this process implementation, under the lower edge of the upper magnetic pole 20, a protruded part 16a which faces to the lower edge of the upper magnetic pole 20 through the recording gap 17 and has the same width as that of the lower edge of this upper magnetic pole 20 is formed at the lower magnetic pole 16 as shown in FIG. 1d. Then, pad bumps and others are formed, and after that, a protection layer 26 is deposited. This protection layer 26 is made of insulation material such as $Al_2O_3$, $SiO_2$ or others, and is deposited preferably with a thickness of 5–500 μm, preferably about 5,000–50,000 nm by sputtering or other methods.

Figure 3:
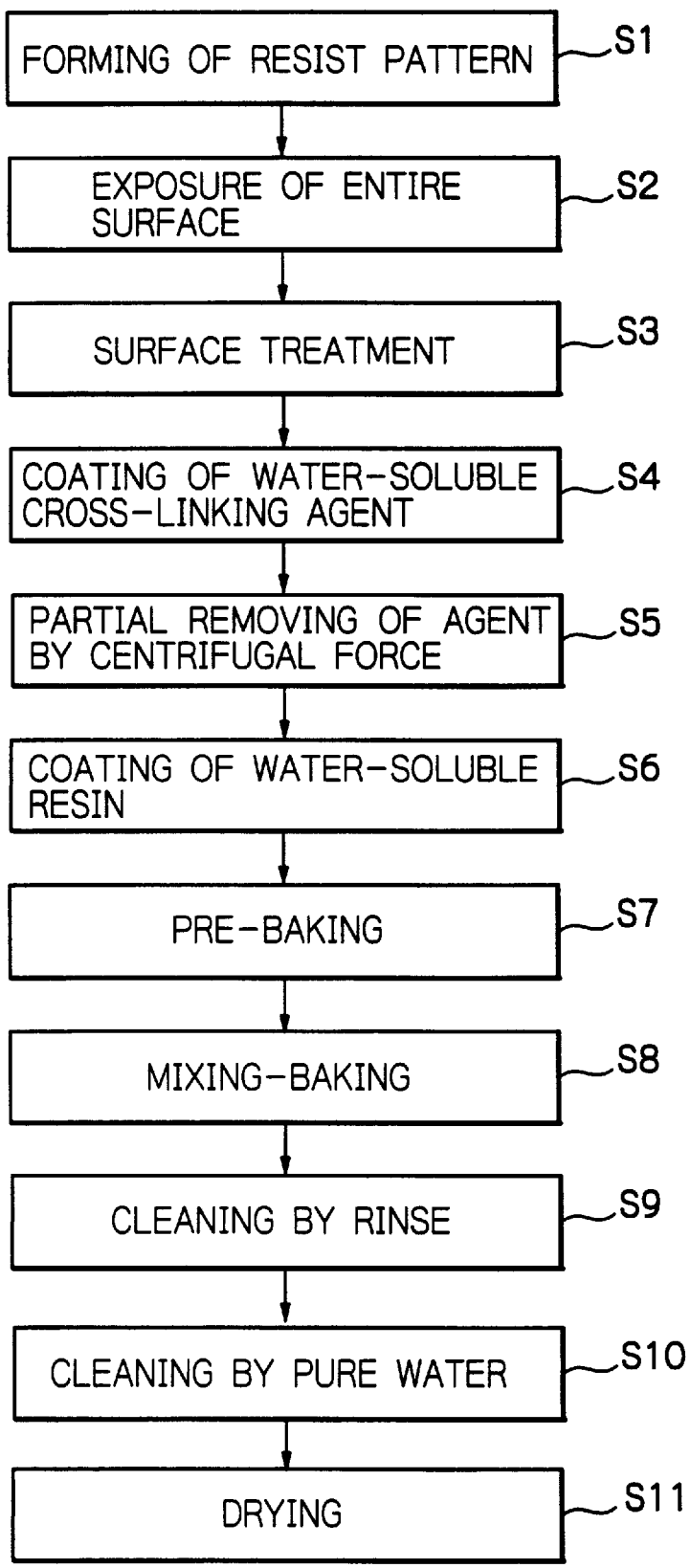
FIG. 3 shows a flow chart illustrating a forming process of a resist pattern with covering layer.

Referring to FIG. 3, a forming process of the above-mentioned resist pattern with covering layer will be described hereinafter.

First, a resist pattern is formed by coating a resist material including a material capable of generating acid from its inside by applying heat on a layer such as the aforementioned metallic under film or others, by exposing through a predetermined mask, and by developing (step S1).

For the resist material, a typical photoresist material, a one-component positive photoresist material, a hydrophobic one-component positive photoresist material or a chemically amplified positive photoresist material, with a structure capable of generating acid by heating may be used.

The typical photoresist material may be mixtures of an alkali-soluble phenol resin and a sensitizer such as a naphthoquinonediazide photosensitive agent. Specific examples of this photoresist material are for example AZP4000 series, AZ92000 series or AZEXP.1131 series made by Clariant (Japan) K.K., FMRS series made by Fijifilm Olin Co., Ltd., or TGMR series made by Tokyo Ohka Kogyo Co., Ltd.

The one-component positive photoresist material may be a resist composition with its photosensitive group directly coupled to a novolak resin. A specific example of this photoresist material is for example a resist composition containing, as an alkali-soluble resin and a sensitizer, a novolak resin obtained by substituting a hydrogen atom in hydroxyl group in the novolak resin having at least one recurring unit represented by following formula (1) by 1,2-naphthoquinonediazidosulfonyl groups, where n is an integer of 1 to 4 and m is an integer of 0 to 3. The novolak resin has a weight-average molecular weight of 1,000 to 10,000 as calculated in the form of polystyrene. The degree of substitution of the 1,2-naphthoquinonediazidosulfonyl groups is 0.03 to 0.27 moles per hydrogen atom.

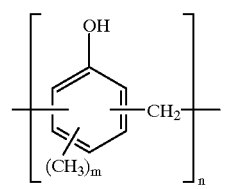

(1)

The hydrophobic one-component positive photoresist material may be a hydrophobic resist composition with its photosensitive group directly coupled to a novolak resin. Specific examples of this photoresist material are for example following (A) or (B).

(A) A resist composition containing a polymer compound of a novolak resin having at least one recurring unit represented by following formula (1) and a weight-average molecular weight of 1,000 to 30,000 as calculated in the form of polystyrene, wherein a part of hydrogen atoms in hydroxyl group in the novolak resin is substituted by 1,2-naphthoquinonediazidosulfonyl groups and a part of hydrogen atoms in the remaining hydroxyl group is substituted by at least one substitution group in functional groups represented by following general formula (2), (3) or (4);

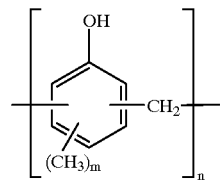

(1)

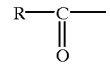

(2)

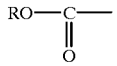

(3)

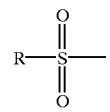

(4)

where n is an integer of 1 to 4 and m is an integer of 0 to 3 in the formula (1), R is straight-chain, branched chain or ring alkyl group with 1–30 carbons, aryl group with 6–20 carbons, or aralkyl group with 7–20 carbons in the formulas (2), (3) and (4).

(B) A resist composition containing a polymer compound of (A) wherein a hydrogen atom in hydroxyl group in the novolak resin is substituted by 1,2-naphthoqiunonediazidosulfonyl group with a degree of substitution of 0.03 to 0.3 moles per hydrogen atom, and a part of hydrogen atoms in the rig hydroxyl group is substituted by at least one substitution group in functional groups represented by the above general formula (2), (3) or (4) with a degree of substitution of 0.01 to 0.8 moles per hydrogen atom.

The chemically amplified positive photoresist material may be mixtures of a resin having an acid catalytic reaction functional group and an acid-generating agent as a main composition, or mixtures of a resin, a resin having an acid catalytic reaction functional group and an acid-generating agent. Specific examples of this photoresist material are for example AZ DX series made by Clariant (Japan) K.K., KRF series made by JSR Corporation, SEPR series made by Shin-Etsu Chemical Co., Ltd., FKR series made by Fijifilm Olin Co., Ltd., TDUR series made by Tokyo Ohka Kogyo Co., Ltd., or APEX-E series made by Shipley Far East Ltd.

Then, the surface of the formed resist pattern is entirely exposed (step S2). This step S2 can be omitted in practice.

Then, a surface treatment of the resist pattern is executed by using an acid liquid or gas (step S3). This step S3 can be omitted in practice.

Thereafter, only a water-soluble cross-linking agent or a water-soluble cross-linking agent with a surface-active agent is coated on the resist pattern by spray coating, spin coating, dipping or other coating method (step S4).

For the water-soluble cross-linking agent, urea series cross-linking agent such as urea, alkoxy-methylene-urea, N-alkoxy-methylene-urea, ethylene-urea, ethylene-urea-carboxylic-acid, melamine series cross-linking agent such as melamine or alkoxy-methylene-melamine, amino series cross-linking agent such as benzoguanamine or glycoluril, or other cross-linking agent inducing cross-linking reaction by the action of acid may be used.

For the surface-active agent, water-soluble surfactant such as for example Furolard made by Sumitomo 3M Ltd. or Nonipol made by Sanyo Chemical Industries, Ltd. may be used.

Then, the coated water-soluble cross-linking agent is partially removed by centrifugal force (step S5). Namely, by rotating the substrate, a part of the water-soluble cross-linking agent is spilled. This step S5 can be omitted in practice.

Thereafter, only a water-soluble resin or a resin material consisting of a water-soluble resin and a low concentration water-soluble cross-linking agent is coated thereon by spray coating, spin coating, dipping or other coating method (step S6).

For the water-soluble resin, for example polyacrylic acid, polyvinyl acetal, polyvinyl pyrrolidone, polyvinyl alcohol, polyethyleneimine, polyethylene oxide, styrene-maleicacid copolymer, polyvinylamine resin, polyarylamine, water-soluble resin containing oxazoline series, water-soluble melamine resin, water-soluble urea resin, alkyd resin, sulfonamide resin, or other resin may be used.

Then, after soft-baking (pre-baking) the water-soluble resin-coated resist pattern if necessary (step S7), thermal treatment (mixing-baking) thereof is implemented (step S8). By virtue of this mixing-baking, acid is generated from the resist pattern and thus cross-linking reaction is occurred by the water-soluble cross-linking agent at the interface with the resist pattern resulting that a covering layer of the resist pattern is formed in the polymer with the water-soluble resin.

According to the present invention, since the water-soluble cross-linking agent is independently coated, a concentration thereof with respect to the water-soluble resin can be optionally determined even to a high concentration value.

Then, the cross-linked portion of the resist pattern is cleaned by using a rise liquid if necessary (step S9). For the rinse liquid, a mixture liquid of a pure water and an alcohol such as methanol, ethanol, propanol or butanol, or a mixture liquid of a pure water and a water-soluble organic solvent such as N-methyl-pyrrolidone, 2-heptane or acetone, which will not dissolve the resist pattern may be used for example.

Thereafter, the resist pattern is cleaned by a pure water (step S10), and then dried (step S11).

According to the aforementioned processes, since the concentration to the water-soluble resin of the water-soluble cross-linking agent can naturally be increased by forming the resist pattern with covering layer, a good cross-linking reaction can be generated even at a low mixing-baking temperature. Therefore, a highly precise resist pattern without the distortion by heat can be stably obtained. In addition, a resist material providing a high resolution but having a low heat-resistance can be used.

Furthermore, since the water-soluble cross-linking agent and the water-soluble resin are not mixed until the coating of the water-soluble resin, and the water-soluble cross-linking agent has a low concentration even if they have been already mixed, the water-soluble cross-linking agent and the water-soluble resin can be kept in the stable state without inducing room-temperature polymerization. Consequently, a more fine and highly precise resist pattern can be stably obtained.

An example of forming process of a resist pattern with a covering layer will be described.

Step S1: a resist pattern with a thickness of 4 $\mu$m and an individual trench width of 0.5 $\mu$m was formed on a substrate by a general method using a hydrophobic one-component positive photoresist material;

Step S2: entire surface was exposed by light of 365 nm and 500 mJ/cm$^2$;

Step S3: no surface treatment was performed;

Step S4: 10 wt % aqueous solution of N-methoxy-methylol-urea was obtained by adding a pure water and an isopropyl alcohol (IPA) to N-methoxy-methylol-urea and by mixing them using an agitator for six hours at room temperature. Then, 5 wt % aqueous solution of N-methoxy-methylol-urea obtained by ½-diluting with a pure water was coated on the resist pattern;

Step S5: the water-soluble cross-linking agent is spilled by rotating the substrate at 1,000 rpm;

Step S6: 4 wt % aqueous solution of polyvinyl acetal resin obtained by adding a pure water to 10 wt % aqueous solution of polyvinyl acetal resin and by mixing them using an agitator for six hours at room temperature was coated;

Step S7: pre-baked at 70° C. for 120 seconds;

Step S8: mixing-baked at 85° C. for 90 seconds;

Step S9: rinsed using 1 wt % aqueous solution of IPA;

Step S10: cleaned using a pure water; and

Step S11: dried at 80° C. for 90 seconds.

In accordance with the above-mentioned processes, a covering layer was formed by cross-linking reaction to narrow the trench width to 0.35 $\mu$m without deforming the resist pattern itself.

In the aforementioned embodiment, the resist pattern for plating the upper magnetic pole of the thin-film magnetic head is formed. However, the present invention is not limited to this but is applicable to any formation of resist pattern of a thin-film device or a thick-film device.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method of forming a resist pattern comprising the steps of:

forming a resist pattern on a substrate or on a layer formed on a substrate using a resist material containing a material which generates acid by exposure or heating;

coating only a water-soluble cross-linking agent on said resist pattern, wherein said water-soluble cross-linking agent is capable of being cross-linked in the presence of acid;

coating a resin material containing at least a water-soluble resin on said water-soluble cross-linking agent; and exposing or heating said resist pattern to generate acid from the resist pattern, wherein a cross-linking reaction of said water-soluble cross-linking agent occurs in the presence of the generated acid to form a covering layer over said resist pattern.

2. The method as claimed in claim 1, wherein said resin material containing at least a water-soluble resin consists of only a water-soluble resin.

3. The method as claimed in claim 1, wherein said resin material containing at least a water-soluble resin consists of a water-soluble resin and a water-soluble cross-linking agent with a low concentration.

4. The method as claimed in claim 1, wherein said method further comprises a step of partially removing the water-soluble cross-linking agent by centrifugal force after coating only the water-soluble cross-linking agent on said resist pattern.

5. The method as claimed in claim 1, wherein said method further comprises a step of entirely exposing a surface of said formed resist pattern before coating the water-soluble cross-linking agent on said resist pattern.

6. The method as claimed in claim 1, wherein said method further comprises a step of performing a surface treatment of said formed resist pattern by using an acid liquid or an acid gas before coating the water-soluble cross-linking agent on said resist pattern.

7. A frame plating method comprising the steps of:

forming a resist pattern on a substrate or on a layer formed on a substrate using a resist material containing a material which generates acid by exposure or heating;

coating only a water-soluble cross-linking agent on said resist pattern, wherein said water-soluble cross-linking agent is capable of being cross-linked in the presence of acid;

coating a resin material containing at least a water-soluble resin on said water-soluble cross-linking agent;

exposing or heating said resist pattern to generate acid from the resist pattern, wherein a cross-linking reaction of said water-soluble cross-linking agent occurs in the presence of the generated acid to form a covering layer over said resist pattern;

plating a pattern using said resist pattern with the covering layer as a frame; and removing said resist pattern with the covering layer.

8. The method as claimed in claim 7, wherein said resin material containing at least a water-soluble resin consists of only a water-soluble resin.

9. The method as claimed in claim 7, wherein said resin material containing at least a water-soluble resin consists of a water-soluble resin and a water-soluble cross-linking agent with a low concentration.

10. The method as claimed in claim 7, wherein said method further comprises a step of partially removing the water-soluble cross-linking agent by centrifugal force after coating only the water-soluble cross-linking agent on said resist pattern.

11. The method as claimed in claim 7, wherein said method further comprises a step of entirely exposing a surface of said formed resist pattern before coating the water-soluble cross-linking agent on said resist pattern.

12. The method as claimed in claim 7, wherein said method further comprises a step of performing a surface treatment of said formed resist pattern by using an acid liquid or an acid gas before coating the water-soluble cross-linking agent on said resist pattern.

13. A method of manufacturing a thin-film magnetic head comprising the steps of:

forming a resist pattern on a substrate or on a layer formed on a substrate using a resist material containing a material which generates acid by exposure or heating;

coating only a water-soluble cross-linking agent on said resist pattern, wherein said water-soluble cross-linking agent is capable of being cross-linked in the presence of acid;

coating a resin material containing at least a water-soluble resin on said water-soluble cross-linking agent;

exposing or heating said resist pattern to generate acid from the resist pattern, wherein a cross-linking reaction of said water-soluble cross-linking agent occurs in the presence of the generated acid to form a covering layer over said resist pattern;

plating a magnetic pole using said resist pattern with the covering layer as a frame; and removing said resist pattern with the covering layer.

14. The method as claimed in claim 13, wherein said resin material containing at least a water-soluble resin consists of only a water-soluble resin.

15. The method as claimed in claim 13, wherein said resin material containing at least a water-soluble resin consists of a water-soluble resin and a water-soluble cross-linking agent with a low concentration.

16. The method as claimed in claim 13, wherein said method further comprises a step of partially removing the water-soluble cross-linking agent by centrifugal force after coating only the water-soluble cross-linking agent on said resist pattern.

17. The method as claimed in claim 13, wherein said method further comprises a step of entirely exposing a surface of said formed resist pattern before coating the water-soluble cross-linking agent on said resist pattern.

18. The method as claimed in claim 13, wherein said method further comprises a step of performing a surface treatment of said formed resist pattern by using an acid liquid or an acid gas before coating the water-soluble cross-linking agent on said resist pattern.

* * * * *